(12) United States Patent
Allen, III

(10) Patent No.: US 6,800,561 B2
(45) Date of Patent: Oct. 5, 2004

(54) ETCHING METHODS, METHODS OF REMOVING PORTIONS OF MATERIAL, AND METHODS OF FORMING SILICON NITRIDE SPACERS

(75) Inventor: Tuman Earl Allen, III, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/261,549

(22) Filed: Sep. 30, 2002

(65) Prior Publication Data

US 2003/0036286 A1 Feb. 20, 2003

Related U.S. Application Data

(60) Continuation of application No. 09/516,635, filed on Mar. 1, 2000, now Pat. No. 6,479,393, which is a division of application No. 09/080,656, filed on May 18, 1998, now Pat. No. 6,235,213.

(51) Int. Cl.[7] .................................. H01L 21/302
(52) U.S. Cl. ................... 438/714; 438/719; 438/724
(58) Field of Search ..................... 438/706, 710, 438/714, 719, 724, 733; 134/1, 3

(56) References Cited

U.S. PATENT DOCUMENTS

| | | |
|---|---|---|
| 4,397,724 A | 8/1983 | Moran |
| 4,436,584 A | 3/1984 | Bernacki et al. |
| 4,513,021 A | 4/1985 | Purdes et al. |
| 4,528,066 A | 7/1985 | Merkling, Jr. et al. |
| 5,026,666 A | 6/1991 | Hills et al. |
| 5,242,538 A | 9/1993 | Hamrah et al. |
| 5,302,240 A | 4/1994 | Hori et al. ................... 156/643 |
| 5,310,454 A | 5/1994 | Ohiwa et al. |
| 5,356,478 A | * 10/1994 | Chen et al. .................... 134/1 |
| 5,431,778 A | 7/1995 | Dahm et al. ............. 156/662.1 |
| 5,445,712 A | 8/1995 | Yanagida |
| 5,468,686 A | 11/1995 | Kawamoto |
| 5,505,816 A | 4/1996 | Barnes et al. ............. 156/662.1 |
| 5,514,247 A | 5/1996 | Shan et al. |
| 5,565,036 A | 10/1996 | Westendorp et al. ......... 118/723 |
| 5,593,540 A | 1/1997 | Tomita et al. |
| 5,626,775 A | 5/1997 | Roberts et al. |
| 5,644,153 A | 7/1997 | Keller |
| 5,647,953 A | 7/1997 | Williams et al. |
| 5,679,211 A | 10/1997 | Huang |
| 5,679,215 A | 10/1997 | Barnes et al. |
| 5,681,424 A | 10/1997 | Saito et al. |
| 5,716,494 A | 2/1998 | Imai et al. |
| 5,756,400 A | 5/1998 | Ye et al. |
| 5,767,021 A | 6/1998 | Imai et al. |

(List continued on next page.)

OTHER PUBLICATIONS

Wolf, S. "Silicon Processing for the VLSI Era", vol. 1: Process Technology, Lattice, Lattice Press, p. 549.

(List continued on next page.)

*Primary Examiner*—Kin-Chan Chen
(74) *Attorney, Agent, or Firm*—Wells St. John P.S.

(57) ABSTRACT

A processing method includes patterning a material over a semiconductive substrate having a center and an edge. The method includes forming a layer of first material against a second material and over the semiconductive substrate and first etching the first material in a reaction chamber. First etching provides a first center-to-edge uniformity across the wafer surface and a first selectivity for the first material relative to the second material. The method also includes second etching the first material to provide a second center-to-edge uniformity across the wafer surface and a second selectivity greater than the first selectivity for the first material relative to the second material. The second center-to-edge uniformity is less than the first center-to-edge uniformity. The method also includes cleaning a component of the first material from at least one sidewall of the reaction chamber between the first and second etchings.

23 Claims, 3 Drawing Sheets

U.S. PATENT DOCUMENTS

| | | |
|---|---|---|
| 5,780,338 A | 7/1998 | Jeng et al. |
| 5,788,869 A | 8/1998 | Dalton et al. |
| 5,798,303 A | 8/1998 | Clampitt |
| 5,814,888 A | 9/1998 | Nishioka et al. |
| 5,817,578 A | 10/1998 | Ogawa |
| 5,830,279 A | 11/1998 | Hackenberg |
| 5,843,226 A | 12/1998 | Zhao et al. |
| 5,843,239 A | 12/1998 | Shrotriya |
| 5,843,847 A | 12/1998 | Pu et al. |
| 5,865,938 A | 2/1999 | Peeters et al. |
| 5,868,853 A * | 2/1999 | Chen et al. .................. 134/1.1 |
| 5,872,061 A | 2/1999 | Lee et al. |
| 5,873,948 A | 2/1999 | Kim |
| 5,879,575 A | 3/1999 | Tepman et al. |
| 5,933,759 A | 8/1999 | Nguyen et al. |
| 5,935,340 A | 8/1999 | Xia et al. |
| 5,950,092 A | 9/1999 | Figura et al. |
| 5,965,463 A | 10/1999 | Cui et al. |
| 5,968,844 A | 10/1999 | Keller |
| 6,010,967 A | 1/2000 | Donohoe et al. |
| 6,093,655 A | 7/2000 | Donohoe et al. |
| 6,103,070 A | 8/2000 | Hong |
| 6,117,764 A | 9/2000 | Figura et al. |
| 6,127,278 A | 10/2000 | Wang et al. |
| 6,136,211 A | 10/2000 | Qian et al. |
| 6,136,214 A | 10/2000 | Mori et al. .................. 216/67 |
| 6,143,665 A | 11/2000 | Hsieh |
| 6,200,412 B1 | 3/2001 | Kilgore et al. |
| 6,258,728 B1 | 7/2001 | Donohoe et al. |
| 6,277,759 B1 | 8/2001 | Blalock et al. |
| 6,434,327 B1 | 8/2002 | Gronet et al. |

OTHER PUBLICATIONS

Product Bulletin: "TCP™ 9100 High–Density Oxide Etch System Productivity Solution for Advanced Oxide Etch", Lam Research Corp., Fremont, CA. (1996?), 4 pages.

U.S. patent application Ser. No. 09/429,880, Donohoe et al., filed Oct. 29, 1999.

U.S. patent application Ser. No. 09/677,478, Bialock et al., filed Oct. 2, 2000.

* cited by examiner

ETCHING METHODS, METHODS OF REMOVING PORTIONS OF MATERIAL, AND METHODS OF FORMING SILICON NITRIDE SPACERS

RELATED PATENT DATA

This patent resulted from a continuation of U.S. patent application Ser. No. 09/516,635, filed on Mar. 1, 2000, entitled "Etching Method, Methods of Removing Portions of Material, and Methods of Forming Silicon Nitride Spacers" and listing T. E. Allen III as inventor, now U.S. Pat. No. 6,479,393 B1, which is a divisional application of U.S. patent application Ser. No. 09/080,656, filed on May 18, 1998, now U.S. Pat. No. 6,235,213, the disclosures of which are incorporated by reference.

TECHNICAL FIELD

The invention pertains to etching methods, such as, for example, methods of forming silicon nitride spacers.

BACKGROUND OF THE INVENTION

A commonly utilized method for removing at least some of a material is plasma etching. Such method can be used, for example, in semiconductor processing. An enormous diversity of materials can be removed by appropriately adjusting etchant components and etching parameters. Among the materials that can be removed are polycrystalline silicon, silicon nitride and silicon oxides. Etchants that can be utilized for removing polycrystalline silicon include HCl, HBr, HI, and $Cl_2$, alone or in combination with each other and/or one or more of He, Ar, Xe, $N_2$, and $O_2$. A suitable etchant that can be utilized for removing a silicon oxide, such as silicon dioxide, is a plasma comprising $CF_4/CHF_3$, or $CF_4/CH_2F_2$. Additionally, a suitable etchant for removing silicon oxide is a plasma comprising a large amount of $CF_3$, and a minor amount of $CH_2F_3$. A suitable etchant for removing silicon nitride is a plasma comprising $CF_4$/HBr.

An example prior art reaction vessel 10 is illustrated in FIG. 1. Reaction vessel 10 comprises a plurality of sidewalls 12 surrounding an internal reaction chamber 14. Also, reaction vessel 10 comprises a radio frequency (RF) generating coil 16 surrounding a portion of reaction chamber 14 and connected to a first RF source 18. RF coil 16 is configured to generate a plasma within reaction chamber 14.

A substrate 20 is received within internal chamber 14 and connected to a second RF source 22. Second RF source 22 is configured to generate an RF bias at substrate 20. Additionally, reaction vessel 10 can comprise coolant coils (not shown) configured to cool a backside of substrate 20 and thereby maintain substrate 20 at a desired temperature during an etching process. It is to be understood that vessel 10 is an exemplary etching vessel. Other constructions are possible. For instance, reaction vessel 10 utilizes a cylindrical inductively driven source geometry, but planar or other inductively driven source geometries can be used. Also, reaction vessel 10 is shown utilizing two separate RF sources, 18 and 22, but other constructions can be used wherein a single RE source can be utilized and the RF power from such source split to form a first RE power at coil 16 and an RF bias at substrate 20.

Substrate 20 can comprise, for example, a monocrystalline silicon wafer. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In operation, plasma gases (not shown) are flowed into internal chamber 14 and converted into a plasma by energy input from reaction coil 16. An RF bias is generated at substrate 20, and such RF bias draws plasma components to a surface of substrate 20 to etch a material at such surface.

During etching of a component from substrate 20, the materials produced by chemical reaction to the substrate with etch gases are released into the internal chamber. Such materials are referred to herein as etch reaction products, or as etchant debris. A method of determining when an etch has penetrated a material is to monitor the concentration of the evolved reaction products and/or etchant gases as the etch proceeds. Monitoring of the etchant debris can be accomplished by, for example, spectroscopic methods, including, for example, ultraviolet-visible spectroscopy and mass spectrometry. Preferably, the monitoring will be performed by an automated system, with software configured to detect when a concentration of a monitored material decreases within the etchant debris.

In the shown embodiment, a monitoring device 28 is provided to observe etchant debris within reaction chamber 14 through a window 26. Monitoring device 28 can comprise, for example, a spectrometer. The spectrometer can be configured to, for example, display a signal corresponding to a concentration of a particular component in the etchant debris, and/or to send such signal to an automated mechanism which performs a function in response to particular signal characteristics. An example automated system is a system comprising an algorithm to analyze the signal and determine from the analysis when an etch penetrates a particular material. The automated system can be configured to terminate the etching process in response to a determination that the etch has penetrated the particular material.

An etch will frequently be conducted in two distinct etching steps, particularly if the etching is to remove a thickness of material that is greater than or equal to 200 Angstroms. First, a highly physical (non-selective) etch is utilized to etch through the majority of a material. Second, a chemical-type etch (highly selective) is utilized to etch through a remainder of the material. A less selective (physical-type) etch generally has better center-to-edge uniformity than a more selective (chemical-type) etch. Center-to-edge uniformity can be understood by reference to FIG. 2 wherein a semiconductive wafer 40 is illustrated. Wafer 40 comprises an edge region 42 and a center region 44. Generally, an etch process will etch material from both edge region 42 and center region 44, as well as from regions intermediate edge region 42 and center region 44. Etching frequently progresses at a different rate at edge region 42 than at center region 44. Thus, as an etch progresses further into a material of semiconductive wafer 40, a disparity between etchant depth at center region 44 and edge region 42 becomes more pronounced. Center-to-edge uniformity is a measure of a degree of disparity between an etch rate at edge region 42 versus an etch rate at center region 44.

Physical-type etch processes generally have a high degree of center-to-edge uniformity, and therefore etch edge region 42 at about the same rate as center region 44. In contrast, chemical-type etches typically have a lower degree of center-to-edge uniformity, and accordingly etch edge region 42 at a significantly different rate than center region 44.

A reason for utilizing a physical-type etch initially in an etching process is to maintain a high degree of center-to-edge uniformity as the bulk of a material is etched. The etching process is then changed to a more chemical-type etch as a final portion of the material is removed to obtain a high degree of selectivity for the material relative to other materials that can be exposed during latter stages of an etch.

A chemical-type etch and a physical-type etch can utilize the same etchants but vary in power settings and pressures, or can utilize different etchants at either the same or different power settings and pressures. If the physical-type etch and chemical-type etch comprise the same etchants, the physical-type etch generally comprises a higher bias power at a substrate, and a lower pressure within a reactor than the chemical-type etch. For example, both chemical-type etching and physical-type etching of a silicon nitride material can utilize an etchant comprising $CF_4/HBr$. However, the physical-type etching will utilize an RF power to primary RF coil 16 of from about 250 to about 800 watts, a bias power to substrate 20 of from about 75 to about 400 watts, and a pressure within internal chamber 14 of from about 5 to about 15 mTorr. In contrast, a chemical-type etch will utilize a power to primary RF coil 16 (FIG. 1) of from about 300 to about 900 watts, a bias power to substrate 20 of less than about 20 watts, and a pressure within internal chamber 14 of from about 40 to about 70 mTorr.

A difficulty in etching methods can occur during monitoring of etchant debris. For instance, a nitride spacer etch is described with reference, to FIGS. 3–5, with a semiconductor wafer fragment 50 illustrated before an etch (FIG. 4) and after the etch (FIG. 5), and a graph of nitrogen-containing components in debris from the etch shown in FIG. 3. In the before-etch-construction of FIG. 4, wafer fragment 50 comprises a substrate 52 having a transistor gate construction 54 formed thereover. Substrate 52 can comprise, for example, monocrystalline silicon lightly doped with a P-type dopant. Transistor gate structure 54 comprises a silicon dioxide layer 56, a polycrystalline silicon layer 58, a metal-silicide layer 60, and an insulative cap 62. Metal-silicide layer 60 can comprise, for example, titanium-silicide or tungsten-silicide, and insulative cap 62 can comprise, for example, silicon dioxide or silicon nitride. In the shown construction, silicon dioxide layer 56 extends beyond lateral peripheries of gate construction 54 and over an upper surface of substrate 52. A silicon nitride layer 64 is formed over silicon dioxide layer 56, as, well as over gate structure 54. In other constructions (not shown) an extent of silicon dioxide layer 56 can be limited to within the lateral peripheries of gate construction 54, and silicon nitride layer 64 can contact substrate 52 in regions beyond the lateral peripheries of gate construction 54.

Referring to FIG. 5, an etch is conducted to pattern silicon nitride layer 64 into sidewall spacers 66. The etching has selectively stopped at oxide layer 56. Preferably, insulative cap 62 comprises silicon dioxide so that the etch of nitride layer 64 also selectively stops at cap 62.

The etch of silicon nitride layer 64 comprises two distinct etch steps, an initial physical-type etch, and a subsequent chemical-type etch. The FIG. 3 graph of nitrogen composition in etchant debris, illustrates the intensity of a 386 nanometer signal obtained as a function of time. The 386 nanometer signal is associated with a C-N excitation. The physical-type etch forms a first peak region 70 of nitrogen-containing material in the etch debris, and the chemical-type, etch forms a second peak region 72 of nitrogen-containing material in the etch debris. A trough region 74 occurs between peak regions 70 and 72, and corresponds to a period of time wherein etching conditions within the reaction chamber are switched from physical-type etching conditions to chemical-type etching conditions.

A difficulty occurs in monitoring peak region 72 to ascertain the precise time at which nitride layer 64 (FIGS. 4 and 5) has been etched through to oxide layer 56 (FIGS. 4 and 5). Careful observation of peak region 72 reveals a break at a location labeled 76. Such break corresponds to a significant drop in nitrogen-containing species within an etch debris, and corresponds to the time at which the shown etch has penetrated silicon nitride layer 64. Although the break at location 76 can be discerned by a person viewing peak region 72, it is difficult to create software algorithms that can accurately detect break 76 on the overall peak-shape of peak region 72. Specifically, peak region 72 comprises a sloped trailing edge before the drop in nitrogen species occurring at location 76. Such sloped trailing edge effectively creates a sloping baseline upon which location 76 is to be identified. It is difficult to create software algorithms that can reproducibly discern a change on a sloping baseline. Accordingly, it is desirable to develop methods for substantially removing the sloping trailing edge of peak region 72.

SUMMARY OF THE INVENTION

In one aspect, the invention encompasses a method of removing at least a portion of a material from a substrate. The material is subjected to a first etching and a second etching in a reaction chamber. A component of the material is removed from at least one sidewall of the reaction chamber between the first etching and the second etching.

In another aspect, the invention encompasses a method of patterning a material over a semiconductive substrate. A layer of first material is formed against a second material and over a semiconductive substrate. The semiconductive substrate comprises a surface having a center and an edge. The first material is subjected to first etching in a reaction chamber. The first etching comprises a first center-to-edge uniformity across the surface of the wafer and comprises a first selectivity for the first material relative to the second material. The first material is subjected to second etching in the reaction chamber. The second etching comprises a second center-to-edge uniformity across the surface of the wafer and comprises a second selectivity for the first material relative to the second material. The second center-to-edge uniformity is less than the first center-to-edge uniformity, and the second selectivity is greater than the first selectivity. A component of the first material is cleaned from at least one sidewall of the reaction chamber between the first etching and the second etching.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It is observed that the sloped trailing edge of prior art peak region 72 (FIG. 3) indicates that there is a diminishing amount of nitrogen containing species within a prior art etching chamber, even before the drop in nitrogen species occurring at location 76. It is also observed that such diminishing amount of nitrogen-containing species can be due to nitrogen-containing components being inadvertently displaced from sidewalls of a reaction chamber and into an etch debris during the etch of silicon nitride layer 64 (FIG. 4). One or more of several mechanisms could occur to deposit nitrogen-containing components on sidewalls of a reaction chamber. The nitrogen-containing components can be deposited on the sidewalls, for example, during either or both of a physical-type etch and a chemical-type etch of a silicon nitride material.

In accordance with the present invention, a sidewall of the reaction chamber is cleaned prior to an etching of a material within the chamber to reduce or eliminate inadvertent release of components from the sidewalls during the etching of the material. In a preferred embodiment of the invention, a sidewall of a reaction chamber is cleaned after a physical-type etch of a material within the chamber, and before a chemical-type etch of the material within the same chamber.

Figure 1:
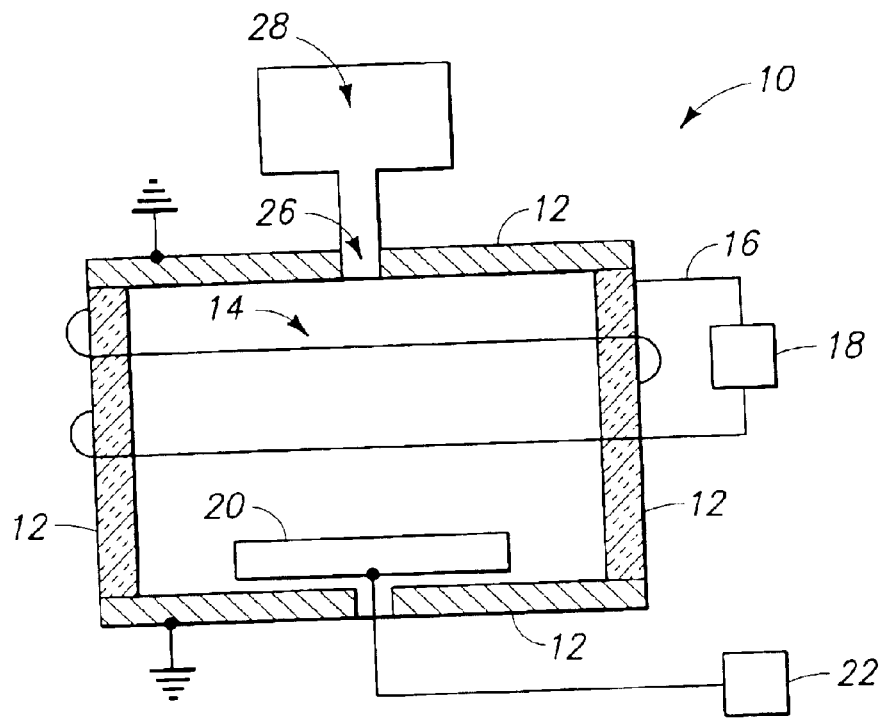
FIG. 1 is a schematic, cross-sectional side-view of a prior art plasma-etching chamber.
Figure 2:
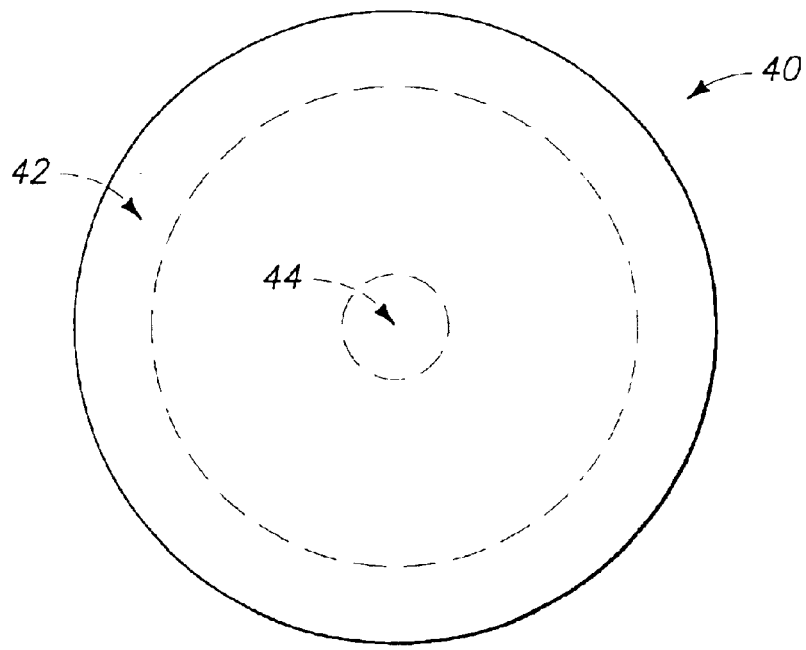
FIG. 2 is a schematic top view of a prior art wafer fragment.

A sidewall of a reaction chamber can be cleaned by a number of methods. For instance, the sidewall can be subjected to a plasma containing one or more strong oxidants. Suitable plasmas can include, for example, $SF_6$, $Cl_2$ or $NF_3$ in combination with oxygen atoms. More specifically, suitable plasmas can include, for example, $SF_6/O_2$, $Cl_2/O_2$, or $NF_3/O_3$. Suitable etch conditions can comprise, for example, 500 watts of power to a primary RF coil (such as RF coil 16 of the prior art reactor construction of FIG. 1) and from about 20 to about 60 mTorr of pressure within a reaction chamber. Preferably, a substrate will remain in the reaction chamber during cleaning of the sidewalls, but no bias power will be applied to the substrate. As no bias power is applied to the substrate, the oxidizing plasma within the chamber is substantially kept from etching materials on the substrate. In other words, the oxidizing plasma substantially selectively removes materials from sidewalls of the reaction chamber and not from the substrate. In the context of this document, the term "substantially selectively" means that the oxidizing plasma removes materials from the sidewalls of the reaction chamber at a rate that is at least 2 times greater than a rate at which materials are removed from the substrate, and preferably at least 10 times greater. As the debris film on a chamber wall is typically very thin (frequently less than 20 Angstroms), the oxidizing plasma treatment of the chamber sidewalls is for a brief enough time period that typically less than 5 Angstroms of material is removed from a wafer in the chamber during the oxidizing plasma treatment.

Figure 4:
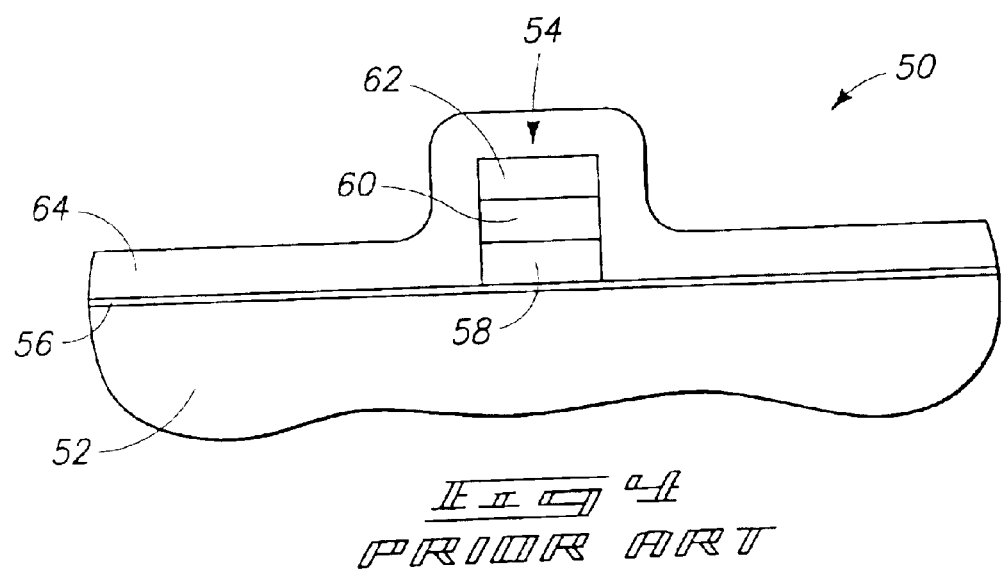
FIG. 4 is a fragmentary, schematic, cross-sectional side-view of a semiconductor wafer fragment at a preliminary processing step of a prior processing method.
Figure 5:
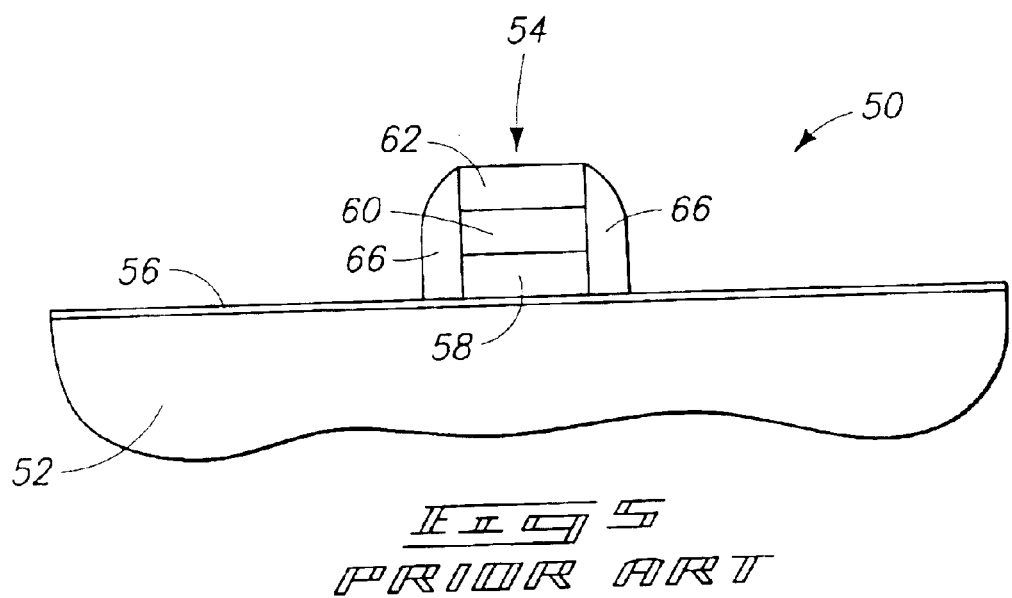
FIG. 5 is a view of the FIG. 4 wafer fragment shown at a prior art processing step subsequent to that of FIG. 4.
Figure 6:
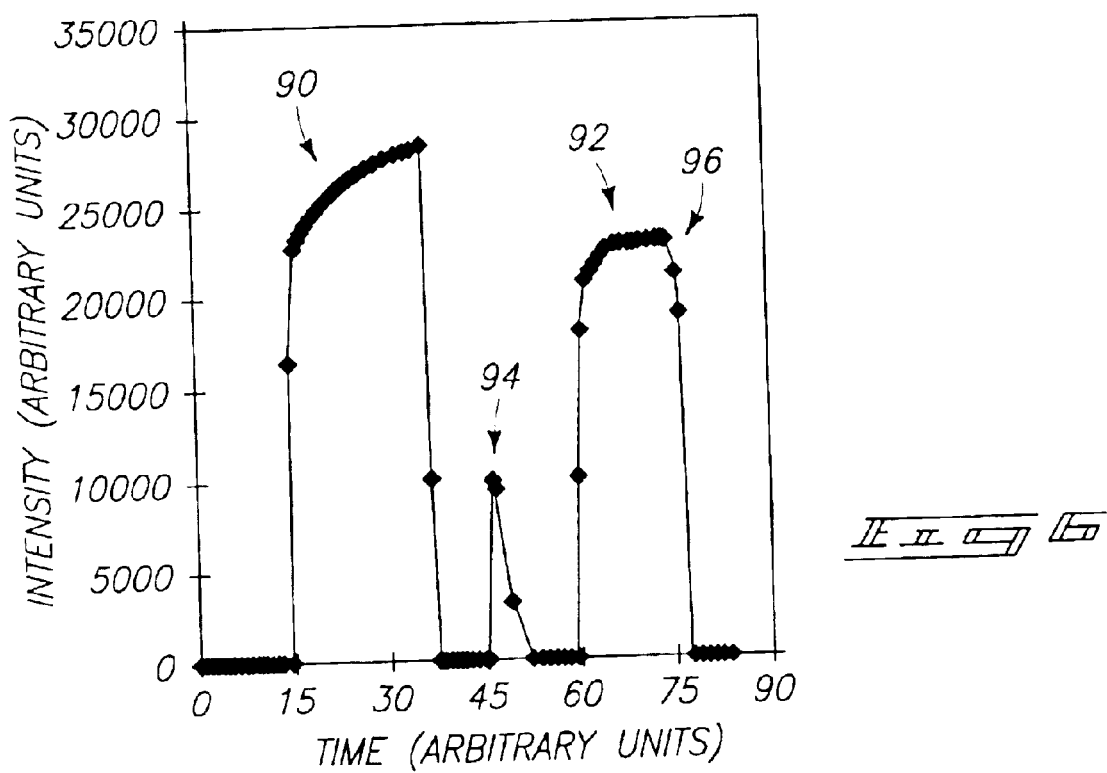
FIG. 6 is a graph of intensity vs. time of a 386 nanometer signal in an etching process conducted in accordance with a method of the present invention.

It is found that cleaning of the sidewalls of a reaction chamber between a physical-type etch and a chemical-type etch can alleviate the monitoring problems discussed above in the "background" section of this disclosure. A graph of nitrogen-component concentration versus time for a silicon nitride etch process conducted in accordance with the present invention is shown in FIG. 6. More specifically, FIG. 6 is a graph of signal intensity at 386 nanometers for a silicon nitride spacer etch, such as the etch described above with reference to FIGS. 4 and 5. Accordingly, the graph of FIG. 6 corresponds to similar processing as that described with reference to the prior art graph of FIG. 3, with a difference that the processing of FIG. 6 incorporates a sidewall cleaning step between a physical-type etch and a chemical-type etch.

The FIG. 6 the graph comprises three distinct peak regions, 90, 92 and 94. Peak region 90 corresponds to nitrogen-comprising components released during a physical-type etch of silicon nitride, and peak region 92 corresponds to nitrogen-components released during a chemical-type etch of the silicon nitride. Accordingly, peak regions 90 and 92 correspond to similar etches as peak regions 70 and 72 of the prior art graph shown in FIG. 3.

Figure 3:
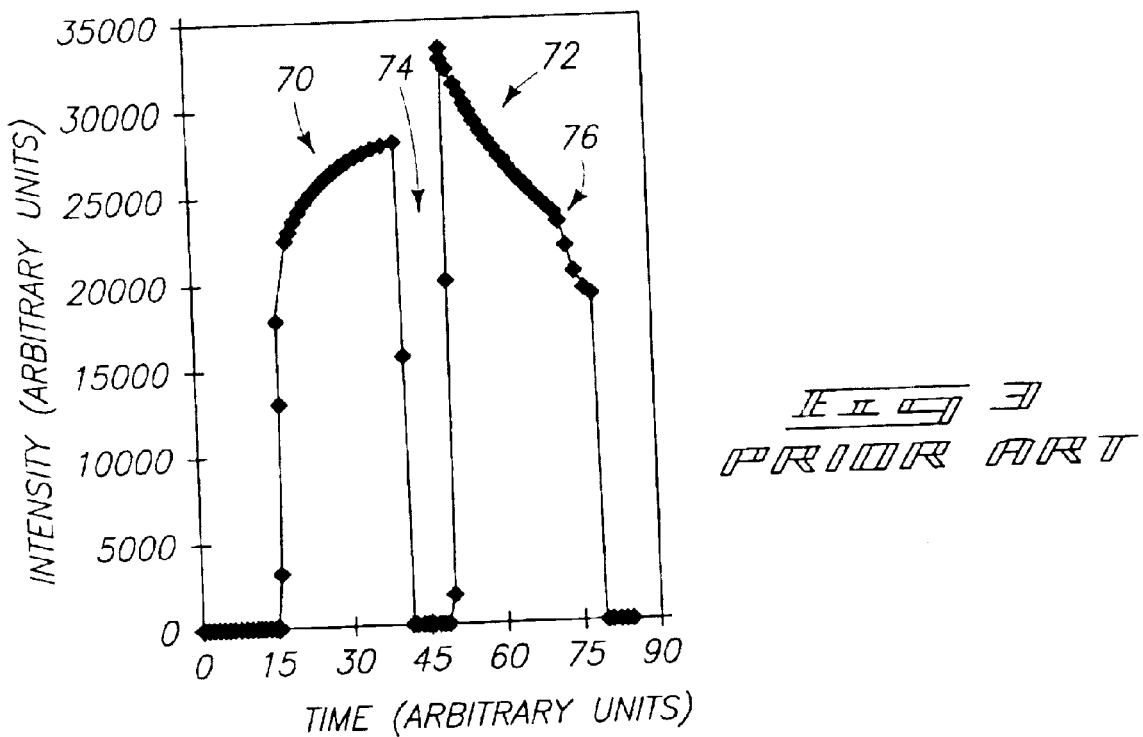
FIG. 3 is a graph of intensity vs. time of a 386 nanometer signal in a prior art etching process.

A difference between the graph of FIG. 6 and that of FIG. 3 is that peak region 92 of the chemical-type etch after a cleaning step of the present invention has a much flatter upper surface than does peak region 72 of the prior art chemical-type etch. Accordingly, peak region 92 provides a relatively flat baseline against which a decrease in nitrogen component concentration of etchant debris can be ascertained. For instance, peak region 92 contains an easily, identified location 96 wherein a nitrogen-component concentration in an etch debris is decreasing. A comparison of peak regions 92 and 72 indicates that a decrease in nitrogen component concentration of etchant debris is significantly easier to detect with peak region 92 than with prior art peak region 72. Such easier detection can aid automated detection mechanisms. For instance, location 96 can be readily recognized even by conventional software algorithms as a distinct drop in intensity relative to the flat baseline at the top of peak region 92. Even in processes wherein automated detection mechanisms are not utilized, peak region 92 can have significant advantages relative to peak region 72. For instance, in manual operations (wherein a human operator is detecting a decrease in an etch debris component concentration) the operator can more readily detect the concentration change relative to peak region 92 than relative to prior art peak region 72.

The third peak region of the graph of FIG. 6 (peak region 94) corresponds to nitrogen-components released from the sidewalls of a reaction chamber during a cleaning step of the present invention. In the shown preferred embodiment, such cleaning step has occurred between a physical-type etch (indicated by peak region 90) and a chemical-type etch (indicated by peak region 92).

A comparison of the graph of a process of the present invention in FIG. 6 with the graph of a prior art process in FIG. 3 indicates that the present invention release of nitrogen-components by sidewall cleaning, and removal of such components from reaction chamber prior to the chemical-type etch, can alleviate complications that were occurring in prior art etch monitoring processes.

Although the process described above is described primarily with reference to a method of etching silicon nitride, it is to be understood that the invention has application to many other etch processes. For instance, the invention can be utilized during etching of silicon oxides or other materials. In such etching, a monitored component can be either oxygen or silicon. Additionally, the invention can be utilized during etching of materials that can consist essentially of silicon, such as, for example, polycrystalline silicon, amorphous silicon or monocrystalline silicon. The silicon can be removed from reaction chamber sidewalls by the strongly oxidizing plasmas described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of patterning a material over semiconductive substrate, comprising:

forming a layer of first material against a second material and over a semiconductive substrate;

first plasma etching the first material;

after the first plasma etching, cleaning a component from at least one sidewall of a reaction chamber by a plasma cleaning process while the substrate remains therein; the cleaning comprising exposing the sidewall and the substrate to conditions which substantially selectively remove the component from the sidewall while not removing such from the substrate; and second plasma etching the first material to provide a center-to-edge uniformity across the surface of the wafer less than that of the first plasma etching to provide a selectivity for the first material relative to the second material greater than that of the first plasma etching.

2. The method of claim 1 wherein the semiconductive substrate comprises monocrystalline silicon and the second material is monocrystalline silicon of the semiconductive substrate.

3. The method of claim 1 wherein the semiconductive substrate comprises monocrystalline silicon and the second material is not monocrystalline silicon.

4. The method of claim 1 wherein the second etching creates a debris, the method further comprising monitoring the debris for the component to determine when the second etching has penetrated the first material.

5. The method of claim 4 wherein the monitoring and determining are accomplished entirely by an automated mechanism, the automated mechanism comprising software configured to recognize a drop in a concentration of the component in the debris.

6. The method of claim 1 wherein the first material is over the second material, wherein the second material does not comprise the component, and wherein the second etching creates a debris, the method further comprising monitoring the debris for the component to determine when the second etching has penetrated the first material to reach the second material.

7. The method of claim 1 wherein the first material comprises silicon nitride and the component cleaned from the at least one sidewall comprises a nitrogen-comprising species.

8. The method of claim 1 wherein the first material comprises silicon oxide and the component cleaned from the at least one sidewall comprises a silicon-comprising species.

9. The method of claim 1 wherein the first material consists essentially of silicon and the component cleaned from the at least one sidewall comprises a silicon-comprising species.

10. The method of claim 1 wherein the first etching comprises a different pressure than the second etching.

11. The method of claim 1 wherein the semiconductive substrate is provided with a different bias power during the first etching than during the second etching.

12. The method of claim 1 wherein the first etching comprises a first plasma etch and the second etching comprises a second plasma etching the first and second plasma etchings forming first and second plasmas, respectively, the first and second plasmas having different chemical compositions from one another.

13. The method of claim 1 wherein the first and second etchings pattern the first material.

14. The method of claim 1 wherein the cleaning comprises exposing the at least one sidewall to a plasma comprising both $SF_6$ and oxygen atoms.

15. The method of claim 1 wherein the cleaning comprises exposing the sidewall to a plasma comprising both chlorine atoms and oxygen atoms.

16. The method of claim 1 wherein the cleaning comprises exposing the at least one sidewall to a plasma comprising both $NF_3$ and oxygen atoms.

17. A method of patterning a material over a semiconductive substrate, the method comprising:

forming a first material layer over a second material layer over a semiconductive substrate;

first etching the first material in a reaction chamber;

after the first etching, cleaning a component from at least one sidewall of the reaction chamber while the substrate remains therein, the cleaning comprising substantially selectively removing the component from the sidewall while not removing the component from the substrate; and second etching the first material to provide a center-to-edge uniformity across the surface of the wafer, the uniformity being less than that achieved by the first etching to provide a greater selectivity for the first material relative to the second material.

18. The method of claim 17, further comprising:

monitoring debris produced by the second etching to determine when the second etching has penetrated the first material.

19. The method of claim 18, wherein the monitoring comprises recognizing a reduction in concentration of the component in the debris.

20. The method of claim 18, further comprising:

monitoring the debris for the component to determine when the second etching has penetrated the first material to reach the second material.

21. The method of claim 17, wherein the cleaning comprises exposing the at least one sidewall to a plasma comprising both $SF_6$ and oxygen atoms.

22. The method of claim 17, wherein the cleaning comprises exposing the sidewall to a plasma comprising both chlorine atoms and oxygen atoms.

23. The method of claim 17, wherein the cleaning comprises exposing the at least one sidewall to a plasma comprising both $NF_3$ and oxygen atoms.

* * * * *

UNITED STATES PATENT AND TRADEMARK OFFICE
CERTIFICATE OF CORRECTION

PATENT NO. : 6,800,561 B2
DATED : October 5, 2004
INVENTOR(S) : Allen, III

It is certified that error appears in the above-identified patent and that said Letters Patent is hereby corrected as shown below:

<u>Column 1,</u>
Line 60, replace "RE" with -- RF --.
Line 61, replace "RE" with -- RF --.

Signed and Sealed this

Twelfth Day of July, 2005

JON W. DUDAS
*Director of the United States Patent and Trademark Office*